United States Patent
Lee et al.

(10) Patent No.: US 9,587,046 B2
(45) Date of Patent: Mar. 7, 2017

(54) PHOTOCURABLE COMPOSITION, PROTECTIVE LAYER INCLUDING THE SAME, AND ENCAPSULATED APPARATUS INCLUDING THE SAME

(71) Applicants: Chang Min Lee, Uiwang-si (KR); Seung Jib Choi, Uiwang-si (KR); Ji Hye Kwon, Uiwang-si (KR); Kyoung Jin Ha, Uiwang-si (KR); Yeon Soo Lee, Uiwang-si (KR)

(72) Inventors: Chang Min Lee, Uiwang-si (KR); Seung Jib Choi, Uiwang-si (KR); Ji Hye Kwon, Uiwang-si (KR); Kyoung Jin Ha, Uiwang-si (KR); Yeon Soo Lee, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 764 days.

(21) Appl. No.: 13/915,648

(22) Filed: Jun. 12, 2013

(65) Prior Publication Data
US 2013/0328028 A1   Dec. 12, 2013

(30) Foreign Application Priority Data
Jun. 12, 2012  (KR) .................. 10-2012-0062918

(51) Int. Cl.
| | | |
|---|---|---|
| C08F 36/20 | (2006.01) | |
| C08F 20/10 | (2006.01) | |
| C08F 30/02 | (2006.01) | |
| H01L 51/52 | (2006.01) | |

(52) U.S. Cl.
CPC ............ *C08F 36/20* (2013.01); *C08F 20/10* (2013.01); *C08F 30/02* (2013.01); *H01L 51/5256* (2013.01)

(58) Field of Classification Search
CPC .......... C08F 30/02; C08F 20/10; C08F 36/20; H01L 51/5256
USPC ........................................... 522/181, 64, 34
See application file for complete search history.

(56) References Cited

U.S. PATENT DOCUMENTS

| | | | | |
|---|---|---|---|---|
| 3,299,015 A * | 1/1967 | Miller | ............... | C07F 9/5304 524/139 |
| 3,495,257 A * | 2/1970 | Vullo | ............... | C07F 9/5304 568/14 |
| 3,696,323 A * | 10/1972 | Kinkaid | ............... | H05K 7/1038 439/525 |
| 3,985,566 A * | 10/1976 | Buhr | ............... | C08F 8/00 430/287.1 |
| 4,041,230 A * | 8/1977 | Huber | ............... | C07F 9/3211 524/108 |
| 4,119,682 A * | 10/1978 | Kleiner | ............... | C08F 30/02 558/182 |
| 4,383,052 A * | 5/1983 | Higo | ............... | A61K 6/0023 523/118 |
| 4,612,343 A * | 9/1986 | Okuzono | ............... | D06P 1/52 524/547 |
| 6,121,494 A * | 9/2000 | Sugiya | ............... | C07F 9/5316 568/14 |
| 6,486,228 B2 * | 11/2002 | Kohler | ............... | C07F 9/3264 427/511 |
| 7,148,382 B2 * | 12/2006 | Wolf | ............... | C07F 9/3252 558/153 |
| 2004/0249100 A1 * | 12/2004 | Chisholm | ......... | C08F 222/1006 526/328 |
| 2010/0036075 A1 * | 2/2010 | Ishino | ............... | A61K 6/0023 526/320 |
| 2011/0224324 A1 * | 9/2011 | Loccufier | ............... | C07C 69/54 522/34 |
| 2012/0046376 A1 * | 2/2012 | Loccufier | ............... | C08F 2/50 522/34 |
| 2012/0142805 A1 * | 6/2012 | Grutzmacher | ............ | C08F 8/40 522/26 |

FOREIGN PATENT DOCUMENTS

KR    10 2006-0084978 A    7/2006

* cited by examiner

*Primary Examiner* — Sanza McClendon
(74) *Attorney, Agent, or Firm* — Lee & Morse, P.C.

(57) ABSTRACT

Disclosed are a photocurable composition which includes (A) a photocurable monomer and (B) a monomer represented by Formula 1, and an apparatus including a protective layers formed of the composition;

[Formula 1]

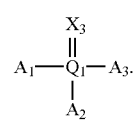

12 Claims, 1 Drawing Sheet

PHOTOCURABLE COMPOSITION, PROTECTIVE LAYER INCLUDING THE SAME, AND ENCAPSULATED APPARATUS INCLUDING THE SAME

CROSS-REFERENCE TO RELATED APPLICATION

The present application claims priority under 35 U.S.C. §119 to and benefit of Korean Patent Application No. 10-2012-0062918, filed on Jun. 12, 2012, in the Korean Intellectual Property Office, and entitled: "Photocurable Composition, Protective Layer Including the Same, and Encapsulated Apparatus Including the Same," which is incorporated by reference herein in its entirety.

BACKGROUND

1. Field

Embodiments relate to a photocurable composition, a protective layer including the same, and an encapsulated apparatus including the same.

2. Description of the Related Art

Organic light emitting diodes (OLED) refer to a structure in which a functional organic material layer is inserted between an anode and a cathode, wherein an exciton having high energy may be created by recombination of a hole injected into the cathode and an electron injected into the anode. The created exciton may move to a ground state, thereby emitting light within a specific wavelength band. The organic light emitting diodes have various merits such as self-luminance, fast response, wide viewing angle, ultra-thinness, high definition, and durability.

SUMMARY

Embodiments are directed to a photocurable composition, including a photocurable monomer, and a monomer represented by Formula 1:

[Formula 1]

In Formula 1, $Q_1$ may be P or As, $X_3$ may be O, S, or N—R wherein R may be hydrogen, a substituted or unsubstituted C1-C30 alkyl group, a substituted or unsubstituted C6-C30 aryl group, or a substituted or unsubstituted C7-C30 arylalkyl group, and $A_1$, $A_2$, and $A_3$ may be the same or different and may be a substituted or unsubstituted C1-C30 alkyl group, a substituted or unsubstituted C6-C30 aryl group, or a group represented by Formula 2 or 3:

[Formula 2]

[Formula 3]

wherein * is a binding site to $Q_1$, $X_4$ may be O, S, or N—R wherein R may be hydrogen, a substituted or unsubstituted C1-C30 alkyl group, a substituted or unsubstituted C6-C30 aryl group, or a substituted or unsubstituted C7-C30 arylalkyl group, $Y_1$ may be a substituted or unsubstituted C1-C30 alkylene group, a substituted or unsubstituted C6-C30 arylene group, a substituted or unsubstituted C7-C30 arylalkylene group, or a substituted or unsubstituted C7-C30 alkylarylene group, and $Z_1$ may be a group represented by Formula 4, 5, or 6,

[Formula 4]

[Formula 5]

[Formula 6]

wherein * is a binding site to $Y_1$, $R_1$ may be hydrogen, or a substituted or unsubstituted C1-C30 alkyl group, $R_2$ may be a substituted or unsubstituted C1-C30 alkylene group, a substituted or unsubstituted C6-C30 arylene group, a substituted or unsubstituted C7-C20 arylalkylene group, or a substituted or unsubstituted C1-C30 alkyleneoxy group, $X_1$ and $X_2$ may be the same or different and may be O, S, or NR wherein R may be hydrogen or a substituted or unsubstituted C1-C30 alkyl group, a substituted or unsubstituted C6-C30 aryl group, or a substituted or unsubstituted C7-C30 arylalkyl group,

$n_1$ may be an integer from 1 to 20, and at least one of $A_1$, $A_2$, and $A_3$ may be a group represented by Formula 2 or 3.

$A_1$, $A_2$, and $A_3$ may be the same or different and at least one of $A_1$, $A_2$, and $A_3$ may be a group represented by Formula 2 in which $X_4$ is O, $Y_1$ is a substituted or unsubstituted C6-C30 arylene group, a substituted or unsubstituted C7-C30 arylalkylene group, or a substituted or unsubstituted C7-C30 alkylarylene group, and $Z_1$ is a group represented by Formula 6 wherein $X_1$ and $X_2$ are O.

The monomer represented by Formula 1 may include at least one (meth)acrylic group, $Q_1$ may be P, $X_3$ may be O, and $A_1$, $A_2$, and $A_3$ may be the same or different and may each include a substituted or unsubstituted C6-C30 aryl or arylene group.

The monomer represented by Formula 1 may be represented by Formula 9 or 10:

[Formula 9]

[Formula 10]

The photocurable monomer may include a monomer having about 1 to about 30 substituted or unsubstituted vinyl groups, substituted or unsubstituted acrylate groups, or substituted or unsubstituted methacrylate groups.

The monomer represented by Formula 1 may be present in an amount of about 0.1 parts by weight to about 20 parts by weight based on 100 parts by weight of the photocurable monomer.

The composition may further include a photopolymerization initiator.

Embodiments are also directed to an encapsulated device encapsulated with the composition according to an embodiment.

Embodiments are also directed to an organic light emitting display apparatus, including a substrate, an organic light emitting diode on the substrate, an inorganic protective layer encapsulating the organic light emitting diode, and an organic protective layer stacked on the inorganic protective layer. The organic protective layer may have an outgas generation amount of about 1000 ppm or less.

A pair of the inorganic protective layer and the organic protective layer may be stacked plural times.

The organic protective layer may be formed of a photocurable composition according to an embodiment.

Embodiments are also directed to an organic light emitting display apparatus, including a substrate, an organic light emitting diode on the substrate, an inorganic protective layer encapsulating the organic light emitting diode, and an organic protective layer stacked on the inorganic protective layer, the organic protective layer having a water vapor transmission rate of about 8.0 g/m²·24 hr or less, as measured at 37.8° C. and 100% relative humidity (RH) for 24 hours at a layer thickness of 5 μm in a thickness direction.

A pair of the inorganic protective layer and the organic protective layer may be stacked plural times.

The organic protective layer may be formed of a photocurable composition according to an embodiment.

BRIEF DESCRIPTION OF DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

Unless otherwise stated, the term "substituted" as used herein means that at least one hydrogen atom among functional groups is substituted with a halogen (F, Cl, Br or I), a hydroxyl group, a nitro group, a cyano group, an imino group (=NH, =NR wherein R is a C1-C10 alkyl group), an amino group [—NH$_2$, —NH(R'), —N(R")(R'"), wherein R', R" and R'" are each independently a C1-C10 alkyl group], an amidino group, a hydrazine or a hydrazone group, a carboxyl group, a substituted or unsubstituted C1-C20 alkyl group, a substituted or unsubstituted C6-C30 aryl group, a substituted or unsubstituted C3-C30 cycloalkyl group, a substituted or unsubstituted C3-C30 heteroaryl group, or a substituted or unsubstituted C2-C30 heterocycloalkyl group.

The term "hetero" as used herein means that a carbon atom is substituted with an atom selected from the group of N, O, S, and P.

An example embodiment relates to a photocurable composition including (A) a photocurable monomer and (B) a monomer represented by the following Formula 1.

(A) Photocurable Monomer

The photocurable monomer refers to a monomer containing a photocurable functional group, for example, a (meth)acrylate group, a vinyl group, and the like.

The photocurable monomer may include a non-phosphorus type monomer which does not contain phosphorus (P), and/or a non-arsenic type monomer which does not contain arsenic (As).

The photocurable monomer may be subjected to photocuring reaction along with a monomer represented by Formula 1 and/or a photopolymerization initiator.

The photocurable monomer may include a monofunctional monomer, a polyfunctional monomer, and mixtures thereof, which contain an unsaturated group. The photocurable monomer may include monomers having about 1 to 30, preferably about 1 to 20, more preferably about 1 to 6 photocurable functional groups, such as substituted or unsubstituted vinyl groups, acrylate groups, or methacrylate groups.

The photocurable monomer may include a mixture of a monofunctional monomer and a polyfunctional monomer. In the mixture, the monofunctional monomer: polyfunctional monomer may be present in a weight ratio from about 1:0.1 to about 1:10, e.g., about 1:2 to about 1:6, about 1:3 to about 1:5, or about 1:4.

Examples of the photocurable monomer may include a C6-C20 aromatic compound having a substituted or unsubstituted vinyl group; an unsaturated carboxylic acid ester having a C1-C20 alkyl group, a C3-C20 cycloalkyl group, a C6-C20 aromatic group, or a hydroxyl group and a C1-C20 alkyl group; an unsaturated carboxylic acid ester having a C1-C20 amino alkyl group; a vinyl ester of a C1-C20 saturated or unsaturated carboxylic acid; a C1-C20 unsaturated carboxylic acid glycidyl ester; a vinyl cyanide compound; an unsaturated amide compound; a monofunctional or polyfunctional (meth)acrylate of a monoalcohol or a polyhydric alcohol, and the like.

Examples of the photocurable monomer may include a C6-C20 aromatic compound having an alkenyl group including a vinyl group such as styrene, α-methyl styrene, vinyl toluene, vinyl benzyl ether, vinyl benzyl methyl ether, and the like; an unsaturated carboxylic acid ester such as methyl (meth)acrylate, ethyl(meth)acrylate, butyl (meth)acrylate, 2-hydroxyethyl(meth)acrylate, 2-hydroxybutyl (meth)acrylate, hexyl(meth)acrylate, octyl(meth)acrylate, nonyl(meth)acrylate, decanyl(meth)acrylate, undecanyl (meth)acrylate, dodecyl(meth)acrylate, cyclohexyl(meth) acrylate, benzyl (meth)acrylate, phenyl(meth)acrylate, and the like; an unsaturated carboxylic acid amino alkyl ester such as 2-aminoethyl(meth)acrylate, 2-dimethylaminoethyl (meth)acrylate, and the like; a saturated or unsaturated carboxylic acid vinyl ester such as vinyl acetate, vinyl benzoate, and the like; a C1-C20 unsaturated carboxylic acid glycidyl ester such as glycidyl(meth)acrylate and the like; a vinyl cyanide compound such as (meth)acrylonitrile and the like; an unsaturated amide compound such as (meth)acrylamide and the like; a monofunctional or polyfunctional (meth)acrylate of a monoalcohol or polyhydric alcohol such as ethylene glycol di(meth)acrylate, triethylene glycol di(meth)acrylate, trimethylolpropane tri(meth)acrylate, 1,4-butanediol di(meth)acrylate, 1,6-hexanediol di(meth)acrylate, octyldiol di(meth)acrylate, nonyldiol di(meth)acrylate, decanediol di(meth)acrylate, undecanediol di(meth)acrylate, dodecyldiol di(meth)acrylate, neopentyl glycol di(meth) acrylate, pentaerythritol di(meth)acrylate, pentaerythritol tri (meth)acrylate, pentaerythritol tetra(meth)acrylate, dipentaerythritol di(meth)acrylate, dipentaerythritol tri(meth) acrylate, dipentaerythritol tetra(meth)acrylate, dipentaerythritol penta(meth)acrylate, dipentaerythritol hexa(meth)acrylate, bisphenol A di(meth)acrylate, novolac epoxy(meth)acrylate, diethyleneglycol di(meth)acrylate, tri (propylene glycol) di(meth)acrylate, poly(propylene glycol) di(meth)acrylate, and the like, without being limited thereto. The 'polyhydric alcohol' refers to an alcohol having two or more, e.g., about 2 to about 20, about 2 to about 10, or about 2 to about 6 hydroxyl groups.

In an implementation, the photocurable monomer may include at least one of a (meth)acrylate having a C1-C20 alkyl group, a di(meth)acrylate of a C2-C20 diol, a tri(meth) acrylate of a C3-C20 triol, and a tetra(meth)acrylate of a C4-C20 tetraol.

The photocurable monomer may be present in an amount of about 1 part by weight to about 99 parts by weight based on 100 parts by weight of (A)+(B) in the photocurable composition. In an implementation, the photocurable monomer may be present in an amount of about 20 parts by weight to about 99 parts by weight, e.g., about 50 parts by weight to about 99 parts by weight or about 94 parts by weight to about 98 parts by weight. Within this range, the photocurable composition may exhibit strong resistance to plasma, which may help lower or prevent outgas generation from plasma and/or lower a water vapor transmission rate in manufacture of thin encapsulation layers.

(B) Monomer Represented by Formula 1

The monomer represented by Formula 1 may refer to monomers which contain phosphorus (P) or arsenic (As) and have a photocurable functional group, such as a (meth) acrylate group, a vinyl group, and the like.

In an embodiment, the monomer represented by Formula 1 may be represented by Formula 1:

[Formula 1]

In Formula 1, $Q_1$ may be P or As; $X_3$ may be O, S, or N—R wherein R may be hydrogen, a substituted or unsubstituted C1-C30 alkyl group, a substituted or unsubstituted C6-C30 aryl group, or a substituted or unsubstituted C7-C30 arylalkyl group; and $A_1$, $A_2$, and $A_3$ may be the same or different and may be a substituted or unsubstituted C1-C30 alkyl group, a substituted or unsubstituted C6-C30 aryl group, or a group represented by Formula 2 or 3:

[Formula 2]

[Formula 3]

In Formulae 2 and 3, * is a binding site to $Q_1$; $X_4$ may be O, S, or N—R wherein R may be hydrogen, a substituted or unsubstituted C1-C30 alkyl group, a substituted or unsubstituted C6-C30 aryl group, or a substituted or unsubstituted C7-C30 arylalkyl group; $Y_1$ may be a substituted or unsubstituted C1-C30 alkylene group, a substituted or unsubstituted C6-C30 arylene group, a substituted or unsubstituted C7-C30 arylalkylene group, or a substituted or unsubstituted C7-C30 alkylarylene group; and $Z_1$ may be a group represented by Formula 4, 5, or 6,

[Formula 4]

[Formula 5]

[Formula 6]

In Formulae 4, 5, and 6 * is a binding site to $Y_1$;

$R_1$ may be hydrogen, or a substituted or unsubstituted C1-C30 alkyl group;

$R_2$ may be a substituted or unsubstituted C1-C30 alkylene group, a substituted or unsubstituted C6-C30 arylene group, a substituted or unsubstituted C7-C20 arylalkylene group, or a substituted or unsubstituted C1-C30 alkyleneoxy group;

$X_1$ and $X_2$ may be the same or different and may be O, S, or NR wherein R may be hydrogen or a substituted or unsubstituted C1-C30 alkyl group, a substituted or unsubstituted C6-C30 aryl group, or a substituted or unsubstituted C7-C30 arylalkyl group; and $n_1$ may be an integer from 1 to 20.

In an embodiment, at least one of $A_1$, $A_2$, and $A_3$ is a group represented by Formula 2 or 3.

In an embodiment, $A_1$ and $A_2$ are a group represented by Formula 2 or 3 wherein $Y_1$ is a substituted or unsubstituted C6-C20 arylene group.

$R_1$ may be hydrogen or a C1-C5 alkyl group.

$R_2$ may be, e.g., a C1-C10 alkylene group, a C1-C6 alkylene group, or a C1-C3 alkylene group.

$Y_1$ may be C7-C30 aryl alkylene group.

$n_1$ may be an integer from 1 to 5.

The monomer represented by Formula 1 may be purchased or synthesized by a suitable method.

The monomer represented by Formula 1 may be included in the photocurable composition together with the photocurable monomer, and may help realize a layer, the water vapor transmission rate and outgas generation amount of which are remarkably reduced after curing of the composition. Further, light absorption in a wavelength range from about 300 nm to about 450 nm of the monomer may be good, which may help increase the photocuring rate of the composition. In addition, P or As may be included, and when the monomer is included in the organic protective layer it may help minimize device damage due to plasma used for deposition of an inorganic protective layer in an encapsulation structure wherein an inorganic protective layer and the organic protective layer are deposited.

In an implementation, the monomer represented by Formula 1 may serve as a photopolymerization initiator and thus the composition may not include another photopolymerization initiator.

The monomer represented by Formula 1 may be present in an amount of about 0.1 parts by weight to about 20 parts by weight based on 100 parts by weight of the (A) photocurable monomer in the photocurable composition. Within this range, the photocurable composition may exhibit strong resistance to plasma, thereby lowering or preventing outgas generation from plasma and/or lowering a water vapor transmission rate in preparation of thin encapsulation layers. In an implementation, the monomer represented by Formula 1 may be present in the composition in an amount of about 1 part by weight to about 10 parts by weight, e.g., about 1 part by weight to about 6 parts by weight.

In an embodiment, the photocurable composition may further include a photopolymerization initiator for photocuring reaction.

(C) Photopolymerization Initiator

As a photopolymerization initiator, a general photopolymerization initiator that allows a photocurable reaction may be used. For example, the photopolymerization initiator may include triazine, acetophenone, benzophenone, thioxanthone, benzoin, phosphor, oxime initiators, and mixtures thereof.

Examples of the triazine initiators may include 2,4,6-trichloro-s-triazine, 2-phenyl-4,6-bis(trichloromethyl)-s-triazine, 2-(3',4'-dimethoxystyryl)-4,6-bis(trichloro methyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl(piperonyl)-6-triazine, 2,4-(trichloro methyl(4'-methoxystyryl)-6-triazine, and mixtures thereof.

Examples of the acetophenone initiators may include 2,2'-diethoxyacetophenone, 2,2'-dibutoxyacetophenone, 2-hydroxy-2-methylpropiophenone, p-t-butyl trichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholino propan-1-one, 2-benzyl-2-dimethylamino-1-(4-morpholinophenyl)-butan-1-one, and mixtures thereof.

Examples of the benzophenone initiators may include benzophenone, benzoyl benzoic acid, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxy benzophenone, and mixtures thereof.

Examples of the thioxanthone initiators may include thioxanthone, 2-methylthioxanthone, isopropyl thioxanthone, 2,4-diethylthioxanthone, 2,4-diisopropyl thioxanthone, 2-chlorothioxanthone, and mixtures thereof.

Examples of the benzoin initiators may include benzoin, benzoin methyl ether, benzoin ethyl ether, benzoin isopropyl ether, benzoin isobutyl ether, benzyl dimethyl ketal, and mixtures thereof.

Examples of the phosphor initiators may include bisbenzoylphenyl phosphine oxide, benzoyldiphenyl phosphine oxide, and mixtures thereof.

Examples of the oxime initiators may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, and mixtures thereof.

The photopolymerization initiator may be present in an amount of about 0.1 parts by weight to about 20 parts by weight based on 100 parts by weight of the (A) photocurable monomer in the photocurable composition. Within this range, photopolymerization may be sufficiently performed under exposure to light, and reduction in transmission owing to unreacted initiator remaining after photopolymerization may be reduced or prevented. In an implementation, the photopolymerization initiator may be present in an amount of about 0.5 parts by weight to about 10 parts by weight, e.g., about 1 part by weight to about 8 parts by weight.

The monomer represented by Formula 1 may be present in an amount of about 1 part by weight to about 99 parts by weight based on 100 parts by weight of (B)+(C). In an implementation, the monomer represented by Formula 1 may be present in an amount of about 1 part by weight to about 80 parts by weight, e.g., about 1 part by weight to about 50 parts by weight or about 20 parts by weight to about 50 parts by weight.

The photocurable composition may exhibit a photocuring rate of about 92% or more. Within this range, curing shrinkage stress after curing may be low, thereby helping to realize layers not generating any shift, and enabling use in encapsulating applications. For example, the photocuring rate may be about 92% to about 99% or about 94% to about 99%.

The photocuring rate may be measured by a general method. For instance, the photocurable composition is coated onto a glass substrate and then subjected to curing at 100 mW/cm$^2$ for 10 seconds. The cured film is cut into specimens and, using the specimens, the photocuring rate is measured by means of FT-IR (Fourier transform infrared spectroscopy). The photocuring rate is calculated under the conditions that are disclosed in the following Experimental Examples.

The photocurable composition according to an embodiment may be used to encapsulate devices including organic light emitting diodes, organic solar cells, and the like.

Another example embodiment relates to an apparatus including an organic protective layer formed of the photocurable composition. The organic protective layer may refer to an encapsulating layer that protects devices such as organic light emitting diodes, organic solar cells, and the like. The organic protective layer may encapsulate the devices, and may help prevent the devices from suffering degradation or oxidization due to environmental factors, such as intrusion of water vapor, oxygen, and the like. In addition, the organic protective layer may exhibit little generation of outgas under high humidity conditions or high temperature and high humidity conditions, thereby helping to minimize outgassing effects with respect to the devices, which in turn may help prevent reduction in performance and shortening of lifespan of the devices.

The apparatus may include a substrate, a device formed on the substrate, an inorganic protective layer encapsulating the device, and an organic protective layer stacked on the inorganic protective layer and formed of the composition according to an embodiment.

Examples of the apparatus may include an organic light emitting display including an organic light emitting device, a solar cell, a liquid crystal display, etc. Examples of the devices may include organic light emitting devices, organic solar cells, and the like. The device may suffer from degradation or oxidation or reduction in properties if exposed to environmental factors such as intrusion of water vapor, oxygen, and the like, and may thus be encapsulated.

The substrate may be a substrate that allows the device for the apparatus to be stacked thereon. Examples of the substrate may include transparent glass, a plastic sheet, a silicone or metal substrate, and the like.

The encapsulated apparatus may have a structure in which one or more devices are sealed with the inorganic protective layer and the organic protective layer. In an implementation, the inorganic protective layer and the organic protective layer have different properties. At least one of the inorganic protective layer and organic protective layer may be attached to the substrate for encapsulating the devices.

The inorganic protective layer may refer to an encapsulating layer which protects the devices, e.g., organic light emitting diodes, organic solar cells, and the like. The inorganic protective layer may seal the devices by bringing the inorganic protective layer into contact with the devices or by encapsulating the interior space in which the devices are placed, without contact with the devices. The inorganic protective layer may block the devices from contacting external oxygen or water vapor, thereby helping prevent degradation or damage of the devices.

The inorganic protective layer may include metal, intermetallic compounds or alloys, oxides of metals or mixed metals, fluorides of metals or mixed metals, nitrides of metals or mixed metals, metal carbides, oxygen nitrides of metals or mixed metals, borides of metals or mixed metals, oxygen borides of metals or mixed metals, silicides of metals or mixed metals, and mixtures thereof. The metals may include a transition metal, a lanthanide metal, silicon (Si), aluminum (Al), indium (In), germanium (Ge), tin (Sn), antimony (Sb), bismuth (Bi), or a mixture thereof.

The inorganic protective layer may be deposited by vacuum processes, for example, by sputtering, chemical vapor deposition, metal organic chemical vapor deposition, plasma chemical vapor deposition, evaporation, sublimation, electrocyclotron resonance-plasma enhanced chemical vapor deposition, or combinations thereof.

The thickness of the inorganic protective layer may be, e.g., about 100 Å to about 2000 Å.

The organic protective layer may be stacked on the inorganic protective layer and may include materials that are different from those of the inorganic protective layer. Thus, the organic protective layer may supplement or reinforce the role of the inorganic protective layer in preventing the devices from contacting external oxygen or water vapor.

The organic protective layer may exhibit little generation of outgas and help minimize the effect of outgas on the devices, thereby helping prevent the devices from suffering degradation or performance decrease due to the outgassing. In an implementation, the organic protective layer may have an outgas generation amount of about 1000 ppm or less. Within this range, the organic protective layer may have an insignificant outgas effect when applied to the devices and help ensure a very long lifespan of the devices. For example, the outgas generation amount may be about 10 ppm to about 1000 ppm, for example about 20 ppm to about 210 ppm, for example about 20 ppm to about 180 ppm.

The outgas generation amount may be measured by a typical method. For example, the photocurable composition is coated onto a glass substrate and then subjected to UV curing by UV irradiation at 100 mW/cm$^2$ for 10 seconds to produce an organic protective layer specimen having a size of 20 cm×20 cm×3 μm (width×length×thickness). For the specimen, the outgas generation amount is determined under the conditions prescribed in Experimental Examples below.

The organic protective layer may be prepared by curing the photocurable composition using a general method.

The thickness of the organic protective layer may be, e.g., about 0.1 μm to about 10 μm.

The organic protective layer may have low water vapor transmission rate and thus may help minimize the effect of water vapor on the devices. The organic protective layer may have a water vapor transmission rate of about 8.0 g/m$^2$·24 hr or less in a thickness direction thereof. The organic protective layer may have a water vapor transmission rate of about 7.8 g/m²·24 hr or less, for example about 0.1 to about 7.8 g/m²·24 hr, for example about 1.8 to about 3.5 g/m²·24 hr.

The water vapor transmission rate may be measured by a general method. For example, a water vapor transmission rate tester (PERMATRAN-W 3/33, manufactured by MOCON) may be employed. A photocurable composition was coated onto an Al sample holder and subjected to UV curing by UV irradiation at 100 mW/cm² for 10 seconds to produce a cured specimen having a 5 μm thick layer. A water vapor transmission rate value was measured at 37.8° C. and 100% RH for 24 hours at a layer thickness of 5 μm.

The inorganic protective layer and the organic protective layer may be included in plural pairs, for example, in two pairs or more, in the apparatus according to an example embodiment. In an embodiment, the inorganic protective layers and the organic protective layers are deposited alternately such as in the order of inorganic protective layer/organic protective layer/inorganic protective layer/organic protective layer (two pairs stacked). In an implementation, a total 10 layers or less, e.g., 7 layers or less, of the inorganic protective layers/organic protective layers may be deposited.

Figure 1:
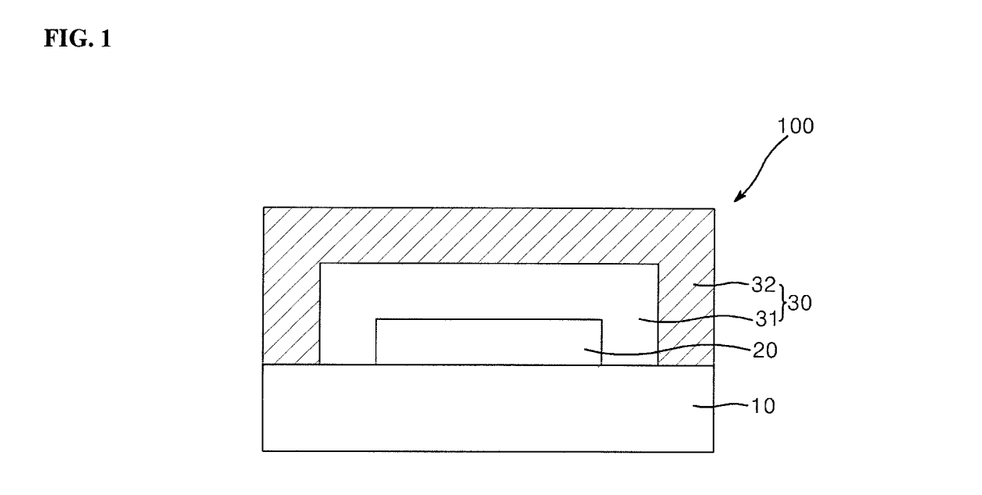
FIG. 1 illustrates a sectional view of an encapsulated apparatus according to an example embodiment.

FIG. 1 shows a sectional view of an encapsulated apparatus according to an example embodiment. Referring to FIG. 1, an encapsulated apparatus 100 includes a substrate 10, a device 20 formed on the substrate 10, and a composite protective layer 30 including an inorganic protective layer 31 and an organic protective layer 32 to encapsulate the device 20, wherein the inorganic protective layer 31 contacts the device 20.

Figure 2:
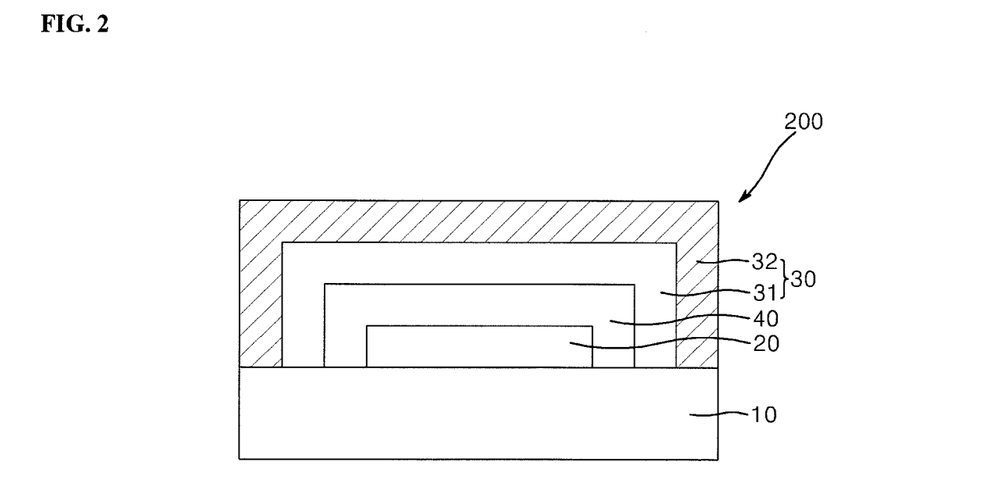
FIG. 2 illustrates a sectional view of an encapsulated apparatus according to another example embodiment.

FIG. 2 shows a sectional view of an encapsulated apparatus according to another example embodiment. Referring to FIG. 2, an encapsulated apparatus 200 includes a substrate 10, a device 20 formed on the substrate 10, and a composite protective layer 30 including an inorganic protective layer 31 and an organic protective layer 32 to encapsulate the device 20, wherein the inorganic protective layer 31 may encapsulate an interior space 40 in which the device 20 is placed.

Although each of the inorganic protective layer and the organic protective layer is illustrated as being formed in a single layer in FIGS. 1 and 2, the inorganic protective layer and the organic protective layer may be deposited in multiple layers. In addition, the apparatus may further include a sealant and/or a substrate (not shown in FIGS. 1 and 2) on a lateral side and/or an upper side of the composite protective layer which includes the inorganic protective layer and the organic protective layer.

The apparatus may be produced by any suitable method. Devices may be deposited on a substrate and then an inorganic protection may be formed thereon. The photocurable composition may be coated to a thickness of, e.g., about 1 μm to about 5 μm by, e.g., spin coating, slit coating, and the like, and light may be irradiated thereto to form an organic protective layer. The procedure of forming the inorganic protective layer and the organic protective layer may be repeated (e.g., a total 10 times or less).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation Example 1

Preparation of a Monomer of Formula 9

To a 500 ml flask provided with a cooling tube and a stirrer, 31 g of 3-(chloromethyl)-2,4,6-trimethylbenzoic acid (Jiangsu Panoxi Chemical), 17 g of potassium hydroxide and 260 g of 2-hydroxyethylacrylate were introduced, followed by stirring at 70° C. for three hours. Then, the reaction liquid was introduced to 2000 ml of water, followed by charging 120 ml of 1N hydrogen chloride aqueous solution over 1 hour. The resultant was subjected to extraction using methylene chloride, which was then subjected to reduced pressure distillation to remove methylene chloride. Through recrystallization in cyclohexane, 40 g of a compound of Formula 7 having 94% purity as measured by HPLC (High performance liquid chromatography) was prepared.

[Formula 7]

To a 500 ml flask provided with a cooling tube and a stirrer, 30 g of the compound of Formula 7 was dissolved in 250 ml of THF (tetrahydrofuran) and heated to 50° C. while stirring. Further, 17 g of thionyl chloride was introduced over 30 minutes and stirred for four hours. After reaction, the resultant was subjected to reduced pressure distillation to remove THF, which in turn was subjected to reduced pressure distillation purification, thereby providing 22 g of a compound of Formula 8. The HPLC purity of the obtained compound was 98%.

[Formula 8]

To a 200 ml flask provided with a cooling tube and a stirrer, 22 g of the compound of Formula 8 was dissolved in 30 ml of THF at room temperature (A flask). In addition, in a 150 ml flask provided with a cooling tube and a stirrer, 1.6 g of lithium and 0.07 g of naphthalene were dissolved in THF. Then, a solution of p,p-dichlorophenyl phosphine in 10 ml THF was introduced to the 150 ml flask for 1 hour, and stirred at room temperature for 22 hours (B flask). At room temperature, the solution in the B flask was introduced to the A flask for 1 hour and then stirred for 4 hours. After reaction, THF was removed by reduced pressure distillation and 40 ml of toluene was re-introduced to dissolve the resultant. 4.2 g of hydrogen peroxide (30%) was introduced at room temperature for 20 minutes and then stirred for 1 hour. After reaction, extraction was carried out using 80 ml of ethyl acetate three times, subjected to reduced pressure distillation to remove ethyl acetate. Through column purification method, 15 g of a compound of Formula 9 having 98% of HPLC purity was obtained.

[Formula 9]

Preparation Example 2

Preparation of a Monomer of Formula 10

To a 500 ml flask provided with a cooling tube and a stirrer, 30 g of 2,4,6-trimethylbenzoyl diphenylphosphine oxide (BASF), 16.7 g of N-bromosuccinimide, and 200 g of carbon tetrachloride were introduced, followed by stirring at 80° C. for 4 hours and then filtered. Then, the reaction liquid was placed in 1000 ml of water, followed by washing to yield an organic layer. The obtained organic layer was provided again to a 500 ml flask including a cooling tube and a stirrer, followed by adding 10.9 g of 2-hydroxyethylacrylate and heated to 60° C. Then, 9.48 g of triethylamine was added dropwise for 30 minutes, heated to 80° C., and stirred for 6 hours. Subsequently, the resultant was cooled to room temperature, filtered to remove the resulting salt, and then subjected to reduced pressure distillation, thereby preparing 32 g of a compound of Formula 10.

[Formula 10]

Details of components used in Examples and Comparative Examples are as follows:

(A) Photocurable monomer: (A1) Hexyl acrylate, (A2) Hexanediol diacrylate, (A3) Pentaerythritol tetraacrylate (Aldrich)

(B) Monomer of Formula 1: (B1) Monomer prepared in Preparation Example 1, (B2) Monomer prepared in Preparation Example 2.

(C) Photopolymerization Initiator: (C1) Darocur TPO (BASF AG), (C2) Irgacure 907 (BASF AG), (C3) OXE-01 (BASF), (C4) OXE-02 (BASF AG)

Examples and Comparative Examples

The (A) photocurable monomer, the (B) monomer of Formula 1 (monomer of Formula 9 or 10) and the (C) photopolymerization initiator were placed in amounts as listed in Table 2 (unit: parts by weight) to a 125 ml brown polypropylene bottle, followed by blending using a shaker for 3 hours to prepare compositions.

The compositions produced in Examples and Comparative Examples were evaluated as to physical properties. Results are shown in Table 2.

Evaluation of Physical Properties

1. Water vapor transmission rate: A water vapor transmission rate tester (PERMATRAN-W 3/33, manufactured by MOCON) was employed. The photocurable composition was spray-coated onto an Al sample holder and subjected to UV curing by UV irradiation at 100 mW/cm$^2$ for 10 seconds to produce a cured specimen having a 5 μm thick layer. Water vapor transmission rate was measured using the water vapor transmission rate tester (PERMATRAN-W 3/33, manufactured by MOCON) at 37.8° C. and 100% RH for 24 hours at a layer thickness of 5 μm.

2. Outgas generation amount of organic protective layer: The photocurable composition was spray-coated onto a glass substrate and the subjected to UV curing by UV irradiation at 100 mW/cm$^2$ for 10 seconds to produce an organic protective layer specimen having a size of 20 cm×20 cm×3 μm (width×length×thickness). A GC/MS tester (Perkin Elmer Clarus 600) was used to measure outgas generation. GC/MS utilized a DB-5MS column (length: 30 m, diameter: 0.25 mm, thickness of fixed phase: 0.25 μm) as a column, and helium gas (flow rate: 1.0 mL/min, average velocity=32 cm/s) as a mobile phase. Further, the split ratio was 20:1 and the temperature condition was set such that temperature was maintained at 40° C. for 3 minutes, heated at a rate of 10° C./minute, and then maintained at 320° C. for 6 minutes. Outgas was collected under a glass size of 20 cm×20 cm, the collection container was a Tedlar bag, the collection temperature was 90° C., the collection time was 30 minutes, N2 purging was conducted at a flow rate of 300 mL/minute and the adsorbent was Tenax GR (5% phenylmethyl polysiloxane). A calibration curve was plotted using a toluene solution in n-hexane in a concentration of 150 ppm, 400 ppm, and 800 ppm as a standard solution, wherein R$^2$ value was obtained as 0.9987. The conditions mentioned above may be summarized in Table 1.

TABLE 1

| Conditions | Details |
|---|---|
| Collection conditions | Glass size: 20 cm × 20 cm<br>Collection container: Tedlar bag<br>Collection temperature: 90° C.<br>Collection time: 30 min<br>N$_2$ purge flow rate: 300 mL/min<br>Adsorbent : Tenax GR |

TABLE 1-continued

| Conditions | Details | |
|---|---|---|
| Conditions for plotting calibration curve | Standard solution: Toluene in n-Hexane Concentration range: 150 ppm, 400 ppm, 800 ppm $R^2$: 0.9987 | |
| GC/MS conditions | Column | DB-5MS → 30 m × 0.25 mm × 0.25 μm (5% phenylmethyl polysiloxane) |
| | Mobile phase | He |
| | Flow | 1.0 mL/min (Average velocity = 32 cm/s) |
| | Split | Split ratio = 20:1 |
| | Method | 40° C. (3 min) – 10° C./min → 320° C. (6 min) |

3. Photocuring rate: The intensity of absorption peaks for the photocurable composition was measured using FT-IR (NICOLET 4700, Thermo) near at 1635 cm$^{-1}$ (C=C) and 1720 cm$^{-1}$ (C=O). First, the photocurable composition was spray-coated onto a glass substrate and then subjected to UV curing by UV irradiation at 100 mW/cm$^2$ for 10 seconds to produce a specimen having a size of 20 cm×20 cm×3 μm (width×length×thickness). The cured film was cut into specimens, which in turn were used to measure intensity of absorption peaks near 1635 cm$^{-1}$ (C=C) and 1720 cm$^{-1}$ (C=O) using FT-IR (NICOLET 4700, by Thermo). The photocuring rate was calculated by Equation 1:

Photocuring rate (%)=|1−(A/B)|×100, wherein A is a ratio of intensity of absorption peak near 1635 cm$^{-1}$ to intensity of absorption peak near 1720 cm$^{-1}$ on the cured film, and B is a ratio of intensity of absorption peak near at 1635 cm$^{-1}$ to intensity of absorption peak near at 1720 cm$^{-1}$ on the photocurable composition.

The layers produced from the photocurable compositions of Comparative Examples 1-4, which did not contain the monomer represented by Formula 1, demonstrated low photocuring rate, high water vapor transmission rate and high outgassing rate, which indicates that they were less suitable than those produced using the Examples.

By way of summation and review, organic light emitting diodes may suffer deterioration in the performance and lifespan thereof due to moisture or oxygen flowing from outside, due to outgases generated inside or outside of the light emitting diodes despite encapsulating, and organic materials and/or electrode materials may be oxidized. Thus, some methods have been considered, such as coating with a photocurable encapsulating agent, attachment of a transparent or opaque moisture absorbent, or provision of frits to a substrate on which an organic light emitting part is foil led. For instance, an encapsulated structure for an organic light emitting diode device may include a protective membrane for encapsulating formed by any one of moisture penetration inhibiting materials among silicone compounds and polymer resins.

As described above, embodiments relate to a photocurable composition, a protective layer including the same, a barrier stack including the same, an encapsulated apparatus including the same, and a method for encapsulating the apparatus using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

TABLE 2

| | | Example | | | | | | | | Comparative Example | | | |
|---|---|---|---|---|---|---|---|---|---|---|---|---|---|
| | | 1 | 2 | 3 | 4 | 5 | 6 | 7 | 8 | 1 | 2 | 3 | 4 |
| A | A1 | 20 | 20 | 20 | 20 | 20 | 20 | 20 | 20 | 20 | 20 | 20 | 20 |
| | A2 | 60 | 60 | 60 | 60 | 60 | 60 | 60 | 60 | 60 | 60 | 60 | 60 |
| | A3 | 20 | 20 | 20 | 20 | 20 | 20 | 20 | 20 | 20 | 20 | 20 | 20 |
| B | B1 | 6 | 3 | 3 | 3 | — | — | — | — | — | — | — | — |
| | B2 | — | — | — | — | 6 | 3 | 3 | 3 | — | — | — | — |
| C | C1 | — | 3 | — | — | — | 3 | — | — | 6 | — | — | — |
| | C2 | — | — | — | 3 | — | — | — | 3 | — | 6 | — | — |
| | C3 | — | — | — | — | — | — | — | — | — | — | 6 | — |
| | C4 | — | — | 3 | — | — | — | 3 | — | — | — | — | 6 |
| Water vapor transmission rate (g/m$^2$ · 24 hr) | | 1.8 | 3.3 | 2.2 | 3.3 | 2.1 | 2.4 | 3.5 | 3.1 | 9.9 | 12.5 | 7.9 | 8.4 |
| Outgas generation amount (ppm) | | 20 | 120 | 150 | 180 | 60 | 210 | 180 | 250 | 1230 | 1740 | 4200 | 2820 |
| Photocuring rate (%) | | 99 | 95 | 95 | 94 | 94 | 92 | 92 | 92 | 91 | 88 | 89 | 89 |

As shown in Table 2, the layers produced from the photocurable compositions of the Examples prepared according to embodiments demonstrated low water vapor transmission rate and significantly reduced outgassing, as compared to those of the Comparative Examples. In addition, the photocurable compositions of the Examples demonstrated a significantly higher photocuring rate as compared to those of the Comparative Examples.

What is claimed is:

1. A photocurable composition, comprising:
a photocurable monomer; and
a monomer represented by Formula 1:

[Formula 1]

wherein $Q_1$ is P or As, $X_3$ is O, S, or N—R wherein R is hydrogen, a substituted or unsubstituted C1-C30 alkyl group, a substituted or unsubstituted C6-C30 aryl group, or a substituted or unsubstituted C7-C30 arylalkyl group; and

$A_1$, $A_2$, and $A_3$ are the same or different and are a substituted or unsubstituted C1-C30 alkyl group, a substituted or unsubstituted C6-C30 aryl group, or a group represented by Formula 2 or 3:

[Formula 2]

[Formula 3]

wherein * is a binding site to $Q_1$; $X_4$ is O, S, or N—R wherein R is hydrogen, a substituted or unsubstituted C1-C30 alkyl group, a substituted or unsubstituted C6-C30 aryl group, or a substituted or unsubstituted C7-C30 arylalkyl group; $Y_1$ is a substituted or unsubstituted C1-C30 alkylene group, a substituted or unsubstituted C6-C30 arylene group, a substituted or unsubstituted C7-C30 arylalkylene group, or a substituted or unsubstituted C7-C30 alkylarylene group; and $Z_1$ is a group represented by Formula 4, 5, or 6,

[Formula 4]

[Formula 5]

[Formula 6]

wherein * is a binding site to $Y_1$;

$R_1$ is hydrogen, or a substituted or unsubstituted C1-C30 alkyl group;

$R_2$ is a substituted or unsubstituted C1-C30 alkylene group, a substituted or unsubstituted C6-C30 arylene group, a substituted or unsubstituted C7-C20 arylalkylene group, or a substituted or unsubstituted C1-C30 alkyleneoxy group;

$X_1$ and $X_2$ are the same or different and are O, S, or NR wherein R is hydrogen or a substituted or unsubstituted C1-C30 alkyl group, a substituted or unsubstituted C6-C30 aryl group, or a substituted or unsubstituted C7-C30 arylalkyl group;

$n_1$ is an integer from 1 to 20; and at least one of $A_1$, $A_2$, and $A_3$ is a group represented by Formula 2 or 3 and at least one of $A_1$, $A_2$, and $A_3$ includes a substituted or unsubstituted C6-C30 aryl or arylene group.

2. The composition as claimed in claim 1, wherein $A_1$, $A_2$, and $A_3$ are the same or different and at least one of $A_1$, $A_2$, and $A_3$ is a group represented by Formula 2 in which $X_4$ is O, $Y_1$ is a substituted or unsubstituted C6-C30 arylene group, a substituted or unsubstituted C7-C30 arylalkylene group, or a substituted or unsubstituted C7-C30 alkylarylene group, and $Z_1$ is a group represented by Formula 6 wherein $X_1$ and $X_2$ are O.

3. The composition as claimed in claim 1, wherein the monomer represented by Formula 1 includes at least one (meth)acrylic group, $Q_1$ is P, $X_3$ is O, and $A_1$, $A_2$, and $A_3$ are the same or different and each include a substituted or unsubstituted C6-C30 aryl or arylene group.

4. The composition as claimed in claim 1, wherein the monomer represented by Formula 1 is represented by Formula 9 or 10:

[Formula 9]

[Formula 10]

5. The composition as claimed in claim 1, wherein the photocurable monomer includes a monomer having about 1 to about 30 substituted or unsubstituted vinyl groups, substituted or unsubstituted acrylate groups, or substituted or unsubstituted methacrylate groups.

6. The composition as claimed in claim 1, wherein the monomer represented by Formula 1 is present in an amount of about 0.1 parts by weight to about 20 parts by weight based on 100 parts by weight of the photocurable monomer.

7. The composition as claimed in claim 1, further comprising a photopolymerization initiator.

8. An encapsulated device encapsulated with the composition as claimed in claim 1.

9. An organic light emitting display apparatus, comprising: a substrate; an organic light emitting diode on the substrate; an inorganic protective layer encapsulating the organic light emitting diode; and an organic protective layer stacked on the inorganic protective layer, the organic protective layer having an outgas generation amount of about 1000 ppm or less, wherein the organic protective layer is prepared from the photocurable composition as claimed in claim 1.

10. The apparatus as claimed in claim 9, wherein a pair of the inorganic protective layer and the organic protective layer is stacked plural times.

11. An organic light emitting display apparatus, comprising: a substrate; an organic light emitting diode on the substrate; an inorganic protective layer encapsulating the organic light emitting diode; and an organic protective layer stacked on the inorganic protective layer, the organic protective layer having a water vapor transmission rate of about 8.0 g/m²·24 hr or less, as measured at 37.8° C. and 100% relative humidity (RH) for 24 hours at a layer thickness of 5 μm in a thickness direction, wherein the organic protective layer is prepared from the photocurable composition as claimed in claim 1.

12. The apparatus as claimed in claim 11, wherein a pair of the inorganic protective layer and the organic protective layer is stacked plural times.

* * * * *